United States Patent
Hashizawa et al.

(10) Patent No.: US 6,680,433 B2
(45) Date of Patent: Jan. 20, 2004

(54) ELECTROMAGNETIC SHIELDING STRUCTURE

(75) Inventors: Shigemi Hashizawa, Shizuoka (JP); Hirotaka Fukushima, Shizuoka (JP); Yutaka Masuda, Shizuoka (JP); Hidehiko Kuboshima, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/103,826

(22) Filed: Mar. 25, 2002

(65) Prior Publication Data

US 2002/0134565 A1 Sep. 26, 2002

(30) Foreign Application Priority Data

Mar. 26, 2001 (JP) ...................................... P2001-087871

(51) Int. Cl.$^7$ ............................................... H01B 11/06
(52) U.S. Cl. ............................... 174/35 R; 174/35 GC; 361/818
(58) Field of Search .................. 174/35 R, 35 GC, 174/35 C; 361/816, 818

(56) References Cited

U.S. PATENT DOCUMENTS 4,786,757 A * 11/1988 Owensby et al. ......... 174/35 C
5,091,604 A * 2/1992 Kirma ........................... 174/2
5,468,911 A * 11/1995 Leve et al. ................ 174/74 R
6,271,464 B1 * 8/2001 Cunningham ............. 174/35 R

FOREIGN PATENT DOCUMENTS

JP      10-241792      9/1998

* cited by examiner

*Primary Examiner*—Dean A. Reichard
*Assistant Examiner*—Adolfo Nino
(74) *Attorney, Agent, or Firm*—Sughrue Mion, PLLC (57) ABSTRACT

In the case where a braid (14) is used as a shielding sheet covering wires (10) over their entire length, a distal end portion of the braid (14) is connected to a mounting member (B) connected to the ground (G), thereby achieving an electromagnetic shielding conduction. At this time, the distal end portion (14a) of the braid (14) is spread outward, and is engaged in an annular groove (20b) of a channel-shaped cross-section in a housing (20), and a braid retaining band (22) is wound on an outer surface of the distal end portion (14a) of the braid (14), and is tightened to fasten this distal end portion. As a result, the distal end portion (14a) can be positively and firmly connected to the mounting member (B), and the effective electromagnetic shielding effect can be expected, and the stable electrical characteristics can be obtained, so that the reliability of the connection can be enhanced.

9 Claims, 6 Drawing Sheets

ELECTROMAGNETIC SHIELDING STRUCTURE

BACKGROUND OF THE INVENTION

This invention relates to an electromagnetic shielding structure used at a portion where electric wires (cables) are connected respectively to input/output terminals of a motor of an electric car or an ordinary electronic equipment.

In the case of connecting wires (cables) to input/output terminals, for example, of a motor mounted on an electric car, there is used a grounding structure in which a shielding member is connected to amounting member (such as a casing of the motor) for grounding purposes, in order to prevent electromagnetic waves from leaking from the wires (cables) to the exterior and also to protect the wires (cables) against the influence of electromagnetic waves from the exterior.

Figure 9:
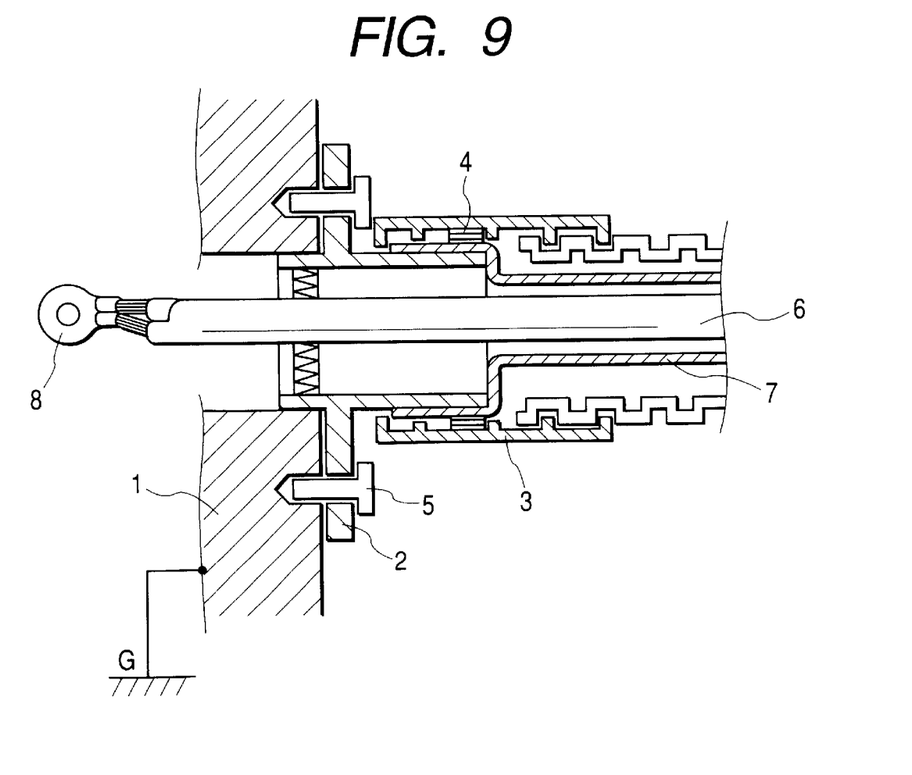
FIG. 9 is a cross-sectional view of a related structure.

One such related electromagnetic shielding structure is disclosed in JP-A-10-241792, and is shown in FIG. 9. Specifically, an electrically-conductive connector body 2 is fixedly secured by bolts 5 to a mounting member 1 connected to the ground G. A pressing spring (resilient member) 4 is mounted between the connector body 2 and a connector retaining member 3. Wires 6 are connected to this connector structures and this connector structure is mounted on the mounting member The wires 6 are covered with an electrically-conductive sheet 7 over their entire length, and are connected respectively to input/output terminals of an equipment via respective metal terminals 8 each press-fastened to an end portion of the corresponding wire. In this case, an end portion of the electrically-conductive sheet 7 is exposed, and this exposed end portion is compressively held between the connector body 2 and the connector retaining member 3 by a resilient force of the pressing spring 4. In this manner, the electrically-conductive sheet 7 is connected to the mounting member 1, connected to the ground G, thereby achieving the electromagnetic shielding conduction.

The electromagnetic shielding structure as shown in FIG. 9, disclosed in the above publication, has the following problem. Namely, the electrically-conductive sheet 7 is pressed into contact with the connector body 2 by the resilient force of the pressing spring 4, and by doing so, the two are connected together. However, any waterproof and rust-proof measures are not provided at this connection portion. When moisture penetrates into the connection portion and when this structure is used for a long period of time in an environment in which the temperature changes, rust develops on the contact surface of the connection portion. The pressing load due to the contact pressure, produced by the pressing spring 4, is limited, and when such rust develops a stable contact resistance of the electrically-conductive sheet 7 relative to the connector body 2 can not be obtained, and therefore the effective electromagnetic shielding effect can not be expected.

SUMMARY OF THE INVENTION

It is therefore an object of this invention to provide an electromagnetic shielding structure capable of achieving the effective electromagnetic shielding by enhancing the reliability of the connection.

In order to solve the aforesaid object, the invention is characterized by having the following arrangement.

(1) An electromagnetic shielding structure comprising:

- a shielding block which is electrically and sealingly connected to a mounting member, connected to a ground, and includes an annular groove formed in an outer peripheral of the shielding block over an entire periphery thereof;
- an elastic seal member which is sealingly fitted and held in the shielding block that a wire is passed through the elastic seal member in intimately contacted relation thereto;
- a flexibility and electrical conductivity shielding sheet covering the wire over entire length thereof; and
- a retaining band engageable with the annular groove for tightly fastening the shielding sheet on the annular groove.

(2) The electromagnetic shielding structure according to (1), wherein the shielding block is an electrically-conductive, tubular housing which is connected to the mounting member, and holds the elastic seal member.

(3) The electromagnetic shielding structure according to (2), wherein the elastic seal member is passed through the mounting member in intimately contacted relation thereto, and is abutted against a rear end of a metal terminal press-fastened to an end portion of the wire.

(4) The electromagnetic shielding structure according to (1), wherein the shielding block is an electrically-conductive lid member which is connected to the mounting member such that the wire is passed through the lid member to be prevented from shaking, and the lid member holds the elastic seal member, and seals the elastic seal member from the exterior.

(5) The electromagnetic shielding structure according to (1), wherein the shielding block includes a plurality of holes for receiving a plurality of the elastic seal members, respectively.

(6) The electromagnetic shielding structure according to (5), wherein a plurality of the wires are passed through the plurality of elastic seal members, respectively.

(7) The electromagnetic shielding structure according to (6), wherein the shielding sheet covers the plurality of wires.

(8) The electromagnetic shielding structure according to (1), wherein opposite ends of the retaining band is fastened by a bolt.

(9) The electromagnetic shielding structure according to (8), wherein the shielding block includes a bolt fastening rib interposed between the opposite ends of the retaining band when the retaining band is fastened on the annular groove.

In the above structure, particularly in the case where the shielding sheet, covering the wire over the entire length thereof, is a braid, a distal end portion of the braid is connected to the mounting member connected to the ground, so as to achieve the electromagnetic shielding conduction. At this time, the distal end portion of the braid is tightly fastened and fixed to the annular groove portion in the electrically-conductive shielding block by the braid retaining band wound on the outer surface of this distal end portion. Therefore, the distal end portion of the braid can be positively and firmly connected to the mounting member. As a result, the effective electromagnetic shielding effect can be expected, and the stable electrical characteristics can be obtained, so that the reliability of the connection can be enhanced.

In the above structure, the shielding-block comprises the housing holding the elastic seal member, and the housing is electrically connected to the mounting member. Therefore, the connection to the ground is achieved.

In the above structure, the elastic seal member is extended into a longer size, and is abutted against the rear end of the metal terminal press-fastened to the end portion of the wire. Therefore, the metal terminal is prevented from rearward movement and withdrawal.

In the above structure, the shielding block comprises the lid member which holds the elastic seal member in a sealed condition, and this lid member is electrically connected to the mounting member. Therefore, the connection to the ground is achieved.

DETAILED DESCRIPTION OF PREFERRED EMBODIMENTS

A preferred embodiment of an electromagnetic shielding structure of the present invention will now be described in detail with reference to the drawings.

FIGS. 1 to 5 show the electromagnetic shielding structure of the first embodiment. In the drawings, reference character B denotes a mounting member serving as a base member on which this structure is mounted, and this mounting member is made of metal such as aluminum although it is not particularly limited to such material. Specific examples of the mounting member B include housings of a motor (mounted on an electric car) and various electronic and electrical equipments. Wire 10 are protected from the influence of electromagnetic waves by connecting the wire 10 to input/output terminal. Mounting holes b are formed through the mounting member B, and this structure is mounted on the mounting member through these mounting holes.

In the illustrated embodiment, four wires 10 are used as a set, and the wires 10 are fixed to the mounting member B, with their end portions passing through this mounting member. These wires, bundled together, are passed through a corrugated tube 15, and in this protected condition, the wires are installed, for example, over a vehicle body of a vehicle, Generally, the wire 10 comprises a conductor (made of copper or the like), and an insulating member formed or coated on the conductor by extrusion to cover the conductor, thereby providing an insulated wire. In this embodiment, the insulated wire is further covered with an outermost sheath 12 to thereby provide a cable. The end portion of each wire 10 is subjected to a stripping treatment, thereby exposing the conductor, and a metal terminal 13, such as one called "a LA terminal", is press-fastened to the exposed conductor, and this metal terminal 13 is electrically connected to the input/output terminal A of the motor by a bolt 11.

A braid 14, which is a specific example of a shielding sheet (so called in the invention) having flexibility and electrical conductivity, is wound on the bundle of (four) wires 10, and the wires 10, together with the braid 14, are passed through the corrugated tube 15, and therefore are kept in a protected condition. In the case where the wire 10 is of the type (such as a shielded wire) in which a braid is integrally molded or embedded in the wire, it is necessary to remove a sheath from an end portion of the wire over a required length so as to expose the braid. However, in this embodiment in which the single braid 14 is fitted on the bundle of (four) wires 10, the end portions of the wires do not need to be subjected to such sheath-removing processing.

Figure 1:
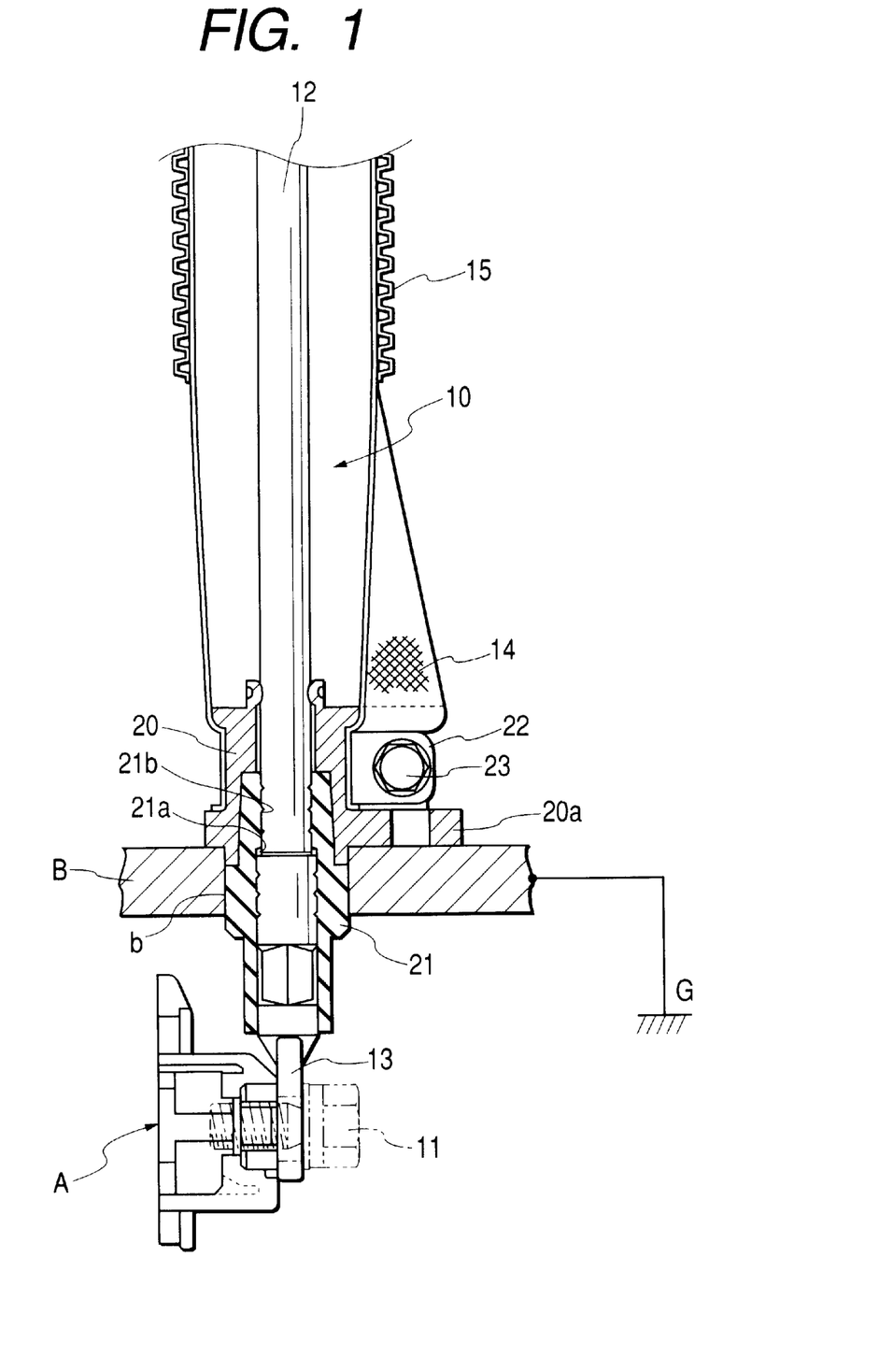
FIG. 1 is a side-elevational, cross-sectional view of a first embodiment of an electromagnetic shielding structure of the invention.
Figure 2:
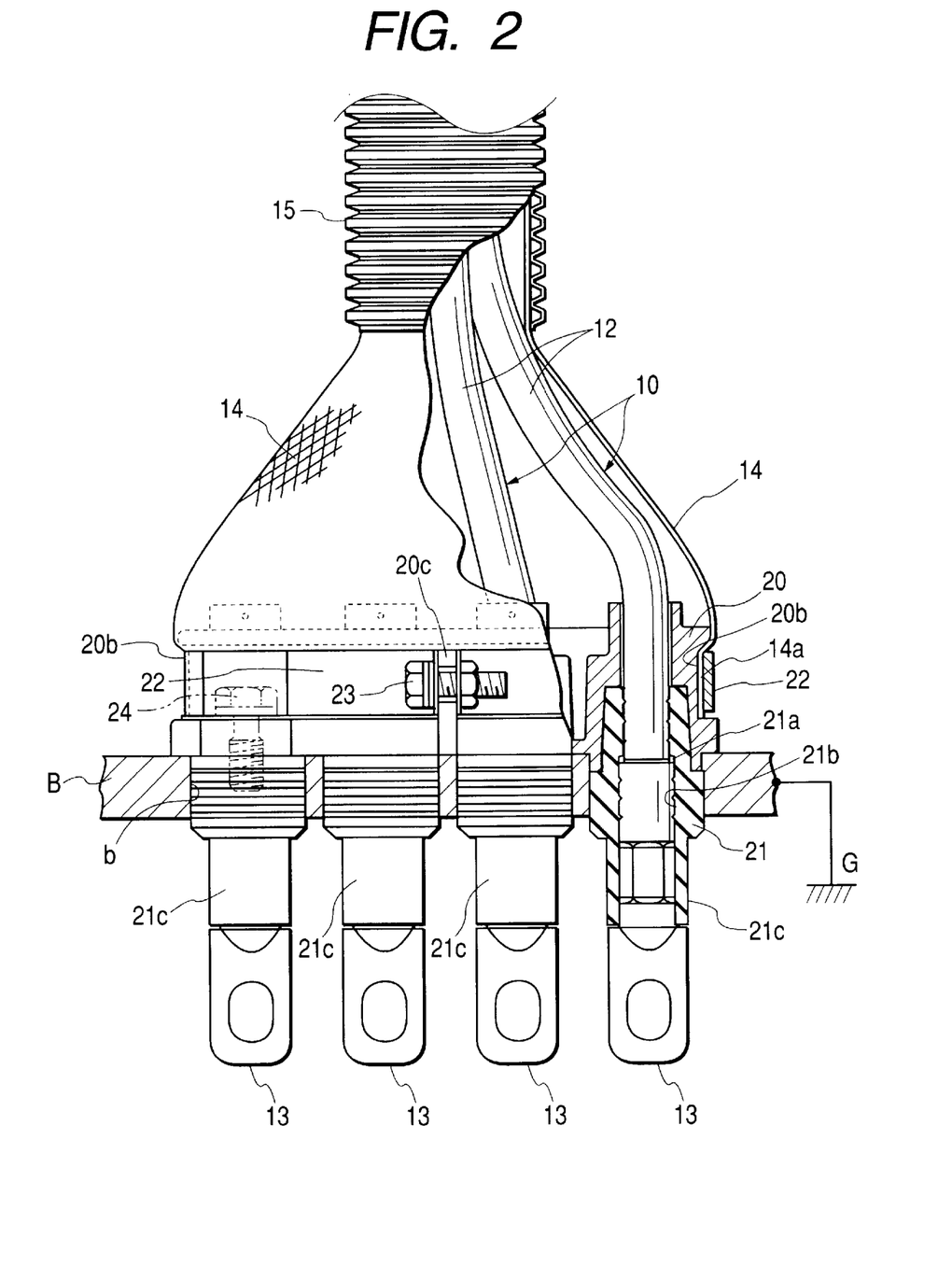
FIG. 2 is a front-elevational, cross-sectional view of the first embodiment.
Figure 3:
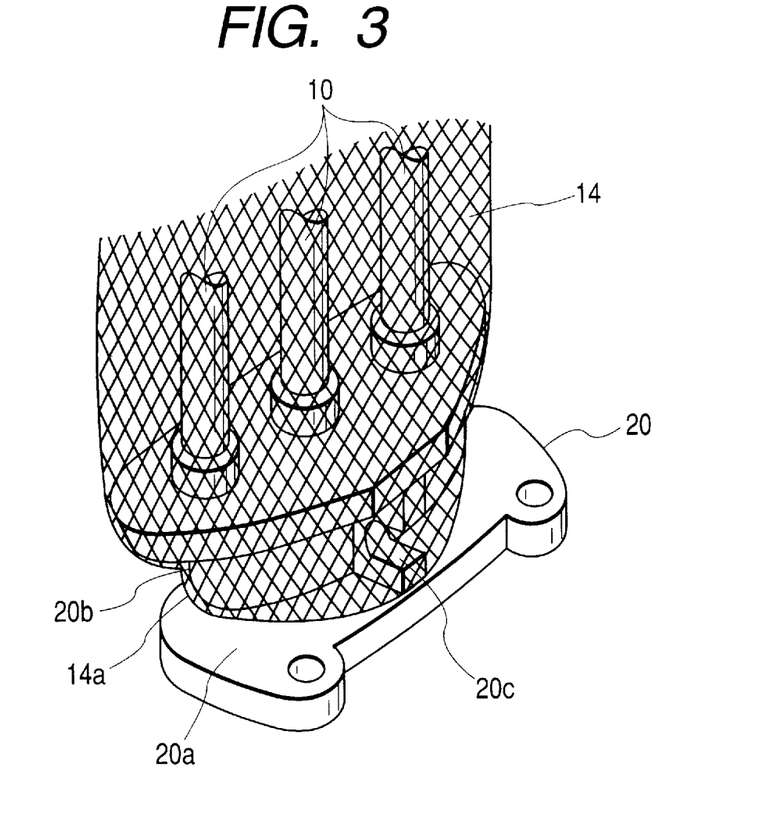
FIG. 3 is a view showing the appearance of the first embodiment in an assembled condition.

After (or before in some cases) the metal terminal 13 is press-fastened to the end portion of each wire 10, the end portion of the wire 10 is held by an electromagnetic shielding structure portion. In this condition, the end portion of the wire is passed through the mounting hole b in the mounting member B, and is mounted thereon. The electromagnetic shielding structure portion is constituted by a housing 20, seal members 21, the braid 14 and a retaining band. The housing 20 (serving as a "shielding block" in the invention), made of electrically-conductive metal, is fitted watertight in the mounting holes b through the respective tubular seal members (hereinafter referred to as "elastic seal member") 21 which are made of rubber, and have elasticity. As shown in FIG. 1, a flange portion 20a is joined to the mounting member B, thereby achieving the electromagnetic shielding conduction. Namely, the housing 20 is connected to the ground G via the mounting member B.

Each elastic seal member 21 is fitted in and held by the housing 20, and is disposed in resilient, intimate contact with this housing 20. The wire 10 is fitted in a holding hole 21b, formed through a tubular body of the seal member along an axis thereof, and is held in intimate contact with an inner peripheral surface of this holding hole 21b. Corrugations or serrations may be formed in the inner peripheral surface of the holding hole 21b so that the outer peripheral surface of the wire 10 can be easily held in intimate contact with this inner peripheral surface. With this arrangement, a watertight seal is formed between the elastic seal member 21 and the housing 20. The elastic seal member 21 has a stepped portion 21a formed generally on a central portion of the inner peripheral surface of the holding hole 21b. A press-fastening portion of the metal terminal 13 is held against this stepped portion 21a. The distal end of this elastic seal member is extended to a connection portion of the metal terminal 13 to provide an extension portion 21c. With this construction, the wire 10, held by this elastic seal member, is prevented from withdrawal, that is, prevented from moving or withdrawn upwardly rearwardly (in the drawings).

Referring to the housing (shielding block) 20, the housing is formed by processing a metal into a generally oval or elliptic plane-shape. An annular groove 20b of a channel-shaped cross-section is formed in an outer peripheral surface of the housing 20 over the entire periphery thereof. A distal end portion 14a of the braid 14 is spread outward, and is engaged in the annular channel-shaped groove 20b. In order to connect the distal end portion 14a of the braid 14 to the annular channel-shaped groove portion 20b in positively and firmly contacted relation thereto, an electrically-conductive retaining band 22 (that is, a braid retaining band 22) of an annular shape is wound on the outer surface of the distal end portion 14a, and is tightened to tightly fasten this distal end portion 14a.

Figure 4:
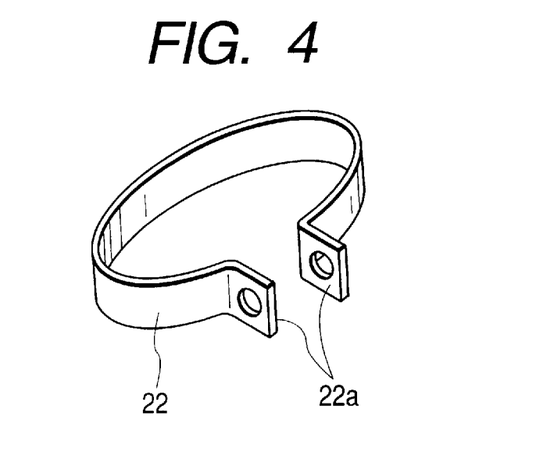
FIG. 4 is a perspective view showing one part of the first embodiment.
Figure 5:
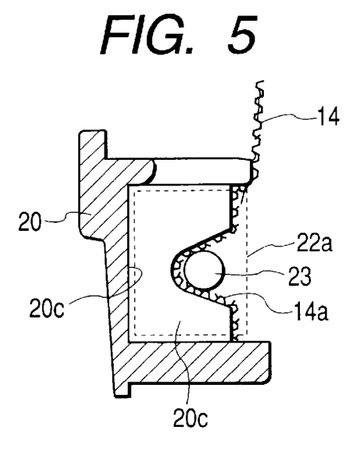
FIG. 5 is a side-elevational, cross-sectional view showing an important portion of the first embodiment.

The braid retaining band 22, which is shown alone in FIG. 4, has fastening flanges 22a formed respectively at its opposite ends, and this braid retaining band 22 can fasten the distal end portion 14a of the braid 14, engaged in the annular channel-shaped groove 20b in the housing 20, in a headband-tying manner by the use of a bolt 23 (see FIGS. 1 and 5). In order that the braid retaining band 22, after fastened by the bolt 23, will not move or slide in the annular channel-shaped groove 20b in the peripheral direction, a bolt fastening rib 20c of a convex shape is formed on the annular channel-shaped groove portion 20b of the housing 20. At this bolt fastening rib 20c, part of the distal end portion 14a of the braid 14 is held between the fastening flanges 22a, formed respectively at the opposite ends of the braid retaining band 22, and the braid retaining band 22 is fastened together with this distal end portion 14a by the bolt 23.

With the above construction, the electromagnetic shielding structure of this first embodiment operates in the following.

The distal end portion 14a of the braid 14 is firmly connected to the annular channel-shaped groove portion 20b in the housing 20, using the braid retaining band 22 and the bolt 23. As a result, the braid 14 is connected to the ground G via the housing 20 and the mounting member B both made of electrically-conductive metal. Therefore, the electromagnetic shielding conduction is achieved.

The braid retaining band 22 is wound on the outer surface of the distal end portion 14a of the braid 14, received in the annular channel-shaped groove 20b in the housing 20, and is firmly tightened in a headband-tying manner to fix this distal end portion 14a. Therefore, as compared with the contact pressure by the pressing spring in the related construction of FIG. 9, the stability of the connection of the braid 14 is markedly enhanced. Besides, the braid 14 will not be disengaged from the housing 20 by an external pulling force or a twisting force, and the rigidity and durability are enhanced. After the connection of the wires 10, the influence of electromagnetic waves can be eliminated by the excellent electrical conductivity and shielding effect. As a result, the stable electrical characteristics can be maintained, and the reliability of the installed wires 10 can be enhanced.

Figure 6:
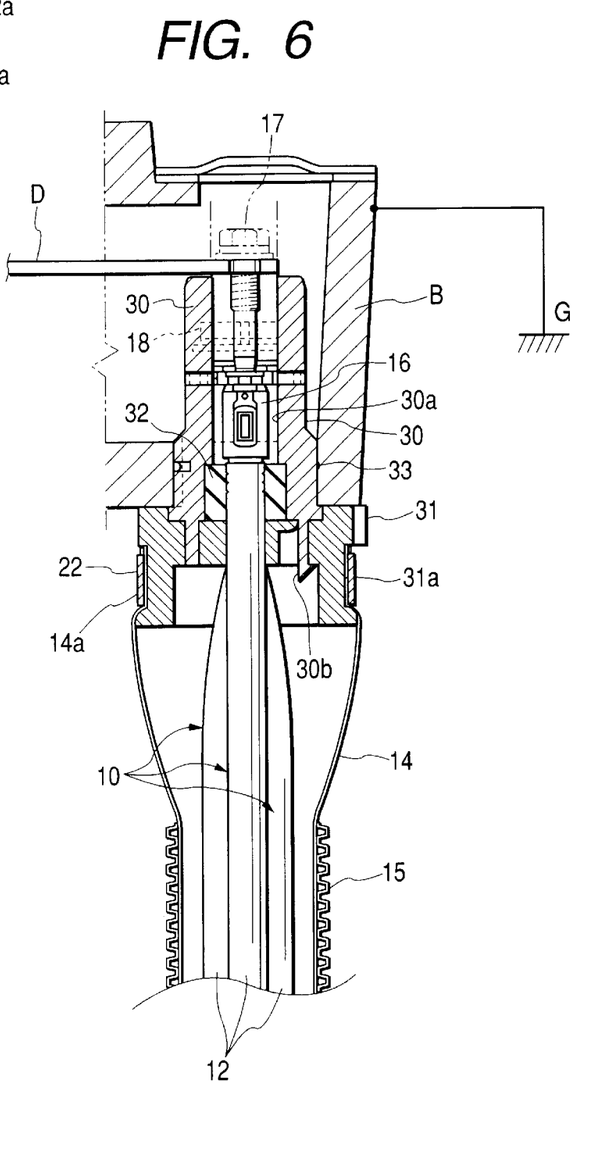
FIG. 6 is a side-elevational, cross-sectional view of a second embodiment of an electromagnetic shielding structure of the invention.
Figure 7:
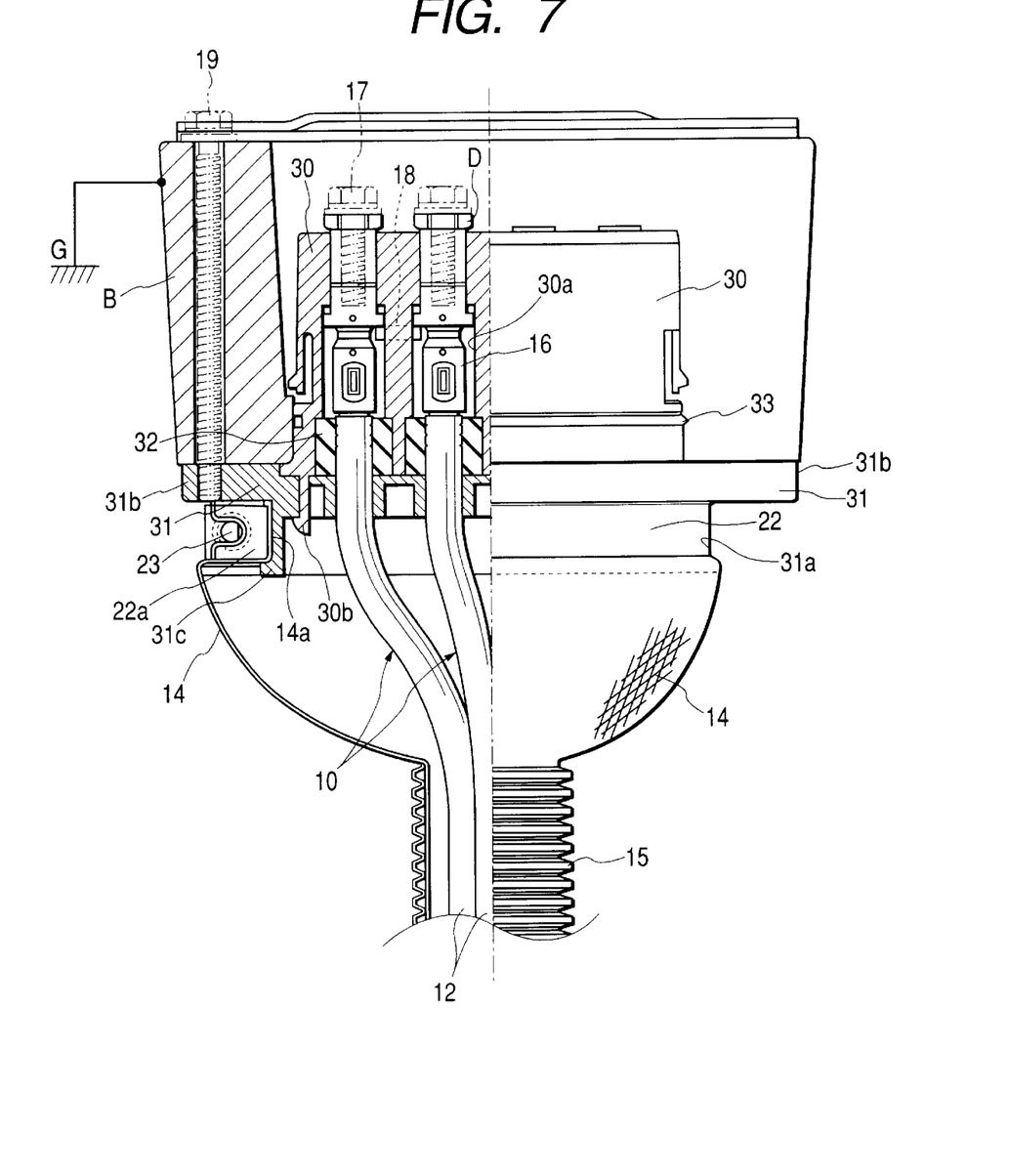
FIG. 7 is a front-elevational, cross-sectional view of the second embodiment.
Figure 8:
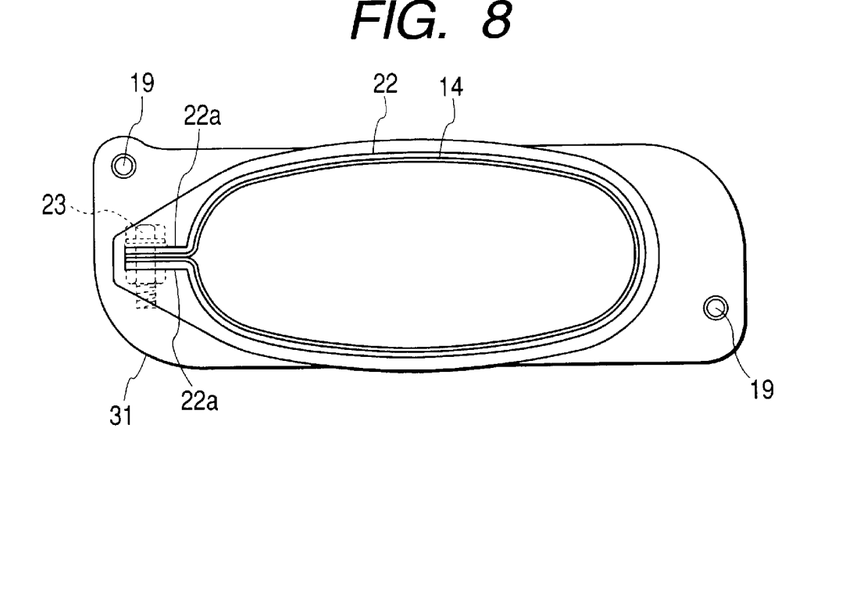
FIG. 8 is a plan view of the second embodiment.

FIGS. 6 to 8 show a second embodiment according to an electromagnetic shielding structure of the invention. FIG. 6 is a side-elevational, cross-sectional view thereof, and FIG. 7 is a half cross-sectional, front-elevational view thereof. Those portions and members, similar or identical to those of the first embodiment of FIGS. 1 to 5, will be designated by identical reference numerals, respectively.

In this embodiment, four wires 10 are bundled together. In this embodiment, a mounting member B is formed into a tubular shape, and a lid member 31 (serving as a shielding block in the invention), formed by processing an electrically-conductive metal blank into a disk-shape, is fixedly secured to this mounting member B by long bolts 19, passing through a peripheral flange portion 31b of this lid member 31, in such a manner that the lid member 31 closes an open bottom of the mounting member B. A housing 30 is fixedly mounted on an upper surface of the lid member 31. An O-ring (elastic seal member) 33 is provided at an area of contact between the housing 30 and the mounting member B, and forms a watertight seal between the housing 30 and the mounting member B.

Holding holes 30a, corresponding in number to the wires 10, are formed through the housing 30. A sheath is removed from an end portion of each wire 10, thereby exposing a conductor (not shown) of the wire, and a metal terminal 16 is press-fastened to the exposed conductor. The metal terminals 16 are fastened by bolts to motor input/output terminals or other terminals D, respectively, and therefore are electrically connected thereto. A tubular elastic seal member 32, made of rubber, is held in a distal end portion of each holding hole 30a in the housing 30, and is disposed in intimate contact with an inner surface of this retaining hole 30a. By incorporating these elastic seal members 32 in the housing 30 in intimately-contacted relation thereto, each metal terminal 16 is prevented from being withdrawn downwardly rearwardly (in the drawings), and therefore each wire 10 is prevented from being withdrawn downwardly rearwardly.

As is clear from FIGS. 6 and 7, an annular groove 31a of a channel-shaped cross-section is formed in an outer peripheral surface of the lid member (shielding block) 31 over the entire periphery thereof. This annular channel-shaped groove 31a has the same function as that of the annular channel-shaped groove 20b formed in the outer peripheral surface of the housing 20 of the first embodiment over the entire periphery thereof. A distal end portion 14a of a braid 14 is spread outward, and is engaged in the annular channel-shaped groove portion 31a in the lid member 31, and therefore is contacted with this groove portion 31a. In order to connect the distal end portion 14a of the braid 14 to the annular channel-shaped groove portion 31a in positively and firmly contacted relation thereto, the braid retaining band 22, shown in FIG. 4 (showing the first embodiment), is wound on the outer surface of the distal end portion 14a, and is tightened.

Namely, as is clear from a plan view of FIG. 8, the distal end portion 14a of the braid 14 is held between the fastening flanges 22a, formed respectively at the opposite ends of the braid retaining band 22, and the braid retaining band 22 is wound in a headband-tying manner, and is fastened together with this distal end portion 14a by the bolt 23.

With the above construction, the electromagnetic shielding structure of this second embodiment operates in the following.

The distal end portion 14a of the braid 14 is firmly connected to the annular channel-shaped groove portion 31a in the lid member (shielding block) 31, using the braid retaining band 22 and the bolt 23. As a result, the braid 14 is connected to the ground G via the lid member 31 and the mounting member B both made of electrically-conductive metal. Therefore, the electromagnetic shielding conduction is achieved.

Namely, as compared with the contact pressure by the pressing spring in the related construction of FIG. 9, the stability of the connection of the braid 14 is markedly enhanced. Besides, the braid 14 will not be disengaged from the lid member (shielding block) 31 by an external pulling force or a twisting force, and the rigidity and durability are enhanced, and after the connection of the wires 10, the influence of electromagnetic waves can be eliminated by the excellent electrical conductivity and shielding effect.

As described above, in the electromagnetic shielding structure of the invention, particularly in the case where the shielding sheet, covering the wire over the entire length thereof, is the braid, the distal end portion of this braid is connected to the mounting member, connected to the ground, so as to achieve the electromagnetic shielding conduction. At this time, the distal end portion of the braid is tightly fastened and fixed to the annular channel-shaped groove portion in the shielding block by the braid retaining band wound on the outer surface of this distal end portion. Therefore, the distal end portion of the braid can be positively and firmly connected to the mounting member B. As a result, the effective electromagnetic shielding effect can be expected, and the stable electrical characteristics can be obtained, so that the reliability of the connection can be enhanced.

Further in the electromagnetic shielding structure of the invention, the shielding block comprises the housing holding the elastic seal member, and this housing is electrically connected to the mounting member, and by doing so, the connection to the ground is achieved.

In the electromagnetic shielding structure of the invention, the elastic seal member is abutted against the rear end of the metal terminal press-fastened to the end portion of the wire, and by doing so, the metal terminal is prevented from rearward movement and withdrawal.

In the electromagnetic shielding structure of the invention, the shielding block comprises the lid member which holds the elastic seal member in a sealed condition, and this lid member is electrically connected to the mounting member, and by doing so, the connection to the ground is achieved.

What is claimed is:

1. An electromagnetic shielding structure comprising:
   a shielding block which is electrically and sealingly connected to a mounting member, connected to a ground, and includes an annular groove formed in an outer peripheral surface of the shielding block over an entire periphery thereof;
   an elastic seal member which is sealingly fitted and held within the shielding block, wherein a wire is passed through the elastic seal member in intimate contact with the elastic seal member;
   a flexible and electrically conductive shielding sheet covering the wire over an entire length thereof; and
   a retaining band engageable with the annular groove for tightly fastening the shielding sheet in the annular groove.

2. The electromagnetic shielding structure according to claim 1, wherein the shielding block is an electrically-conductive, tubular housing which is connected to the mounting member, and holds the elastic seal member.

3. The electromagnetic shielding structure according to claim 2, wherein the elastic seal member is passed through the mounting member in intimately contacted relation thereto, and is abutted against a rear end of a metal terminal press-fastened to an end portion of the wire.

4. The electromagnetic shielding structure according to claim 1, wherein the shielding block is an electrically-conductive lid member which is connected to the mounting member such that the wire is passed through the lid member to be prevented from shaking, and the lid member holds the elastic seal member, and seals the elastic seal member from the exterior.

5. The electromagnetic shielding structure according to claim 1, wherein the shielding block includes a plurality of holes for receiving a plurality of the elastic seal members, respectively.

6. The electromagnetic shielding structure according to claim 5, wherein a plurality of the wires are passed through the plurality of elastic seal members, respectively.

7. The electromagnetic shielding structure according to claim 6, wherein the shielding sheet covers the plurality of wires.

8. The electromagnetic shielding structure according to claim 1, wherein opposite ends of the retaining band is fastened by a bolt.

9. The electromagnetic shielding structure according to claim 8, wherein the shielding block includes a bolt fastening rib interposed between the opposite ends of the retaining band when the retaining band is fastened on the annular groove.

* * * * *